United States Patent
Lammert et al.

(10) Patent No.: US 6,638,366 B2
(45) Date of Patent: Oct. 28, 2003

(54) AUTOMATED SPRAY CLEANING APPARATUS FOR SEMICONDUCTOR WAFERS

(75) Inventors: Michael D. Lammert, Manhattan Beach, CA (US); Victor J. Watson, Rancho Palos Verdes, CA (US); John M. DiMond, San Pedro, CA (US); Michael E. Barsky, Sherman Oaks, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 212 days.

(21) Appl. No.: 09/855,962

(22) Filed: May 15, 2001

(65) Prior Publication Data

US 2002/0170579 A1 Nov. 21, 2002

(51) Int. Cl.[7] .................................................. B08B 3/02
(52) U.S. Cl. ................................. 134/33; 134/2; 134/6; 134/7; 134/18; 134/144; 134/32
(58) Field of Search ............................. 134/33, 34, 36, 134/102.1, 144, 58 R, 172, 902, 58, 2, 6, 7, 18, 32, 42, 57 R, 93

(56) References Cited

U.S. PATENT DOCUMENTS

| | | | | |
|---|---|---|---|---|
| 4,859,605 A | * | 8/1989 | Metzger et al. | 436/43 |
| 5,125,979 A | * | 6/1992 | Swain et al. | 134/7 |
| 5,865,901 A | * | 2/1999 | Yin et al. | 134/2 |
| 5,997,653 A | * | 12/1999 | Yamasaka | 134/2 |

* cited by examiner

*Primary Examiner*—Randy Gulakowski
*Assistant Examiner*—Gentle E. Winter
(74) *Attorney, Agent, or Firm*—Ronald M. Goldman

(57) ABSTRACT

Semiconductor wafer (11) are uniformly and thoroughly cleaned of particulate and organic contaminants by sweeping the wafer with a hydraulic broom that sprays cleaning solution onto the wafer. The broom contains an aspirating nozzle (3) for connection to a source of pressurized gas, such as nitrogen, and to a source of cleaning fluid, such as acetone, wherein cleaning fluid aspirated by the gas stream is expressed through the nozzle outlet to impact the surface of the wafer, dislodging particulate matter and dissolving organic contaminants. A programmed controller (9) controls movement of the hydraulic broom relative to the wafer to ensure that the entire surface is cleaned and permits a variety of sweeping patterns.

17 Claims, 11 Drawing Sheets

AUTOMATED SPRAY CLEANING APPARATUS FOR SEMICONDUCTOR WAFERS

FIELD OF THE INVENTION

This invention relates to cleaning of semiconductor wafers, including Germanium, Silicon and all other semiconductor compounds, such as Gallium Arsenide ("GaAs") and Indium Phosphide ("InP") and, more particularly, to a method and apparatus for thoroughly spray cleaning the surface of semiconductor wafers of particulate and organic contaminants in a manner that assures uniform and reproducible cleanliness of each wafer cleaned.

BACKGROUND

Semiconductor devices are typically fabricated on single crystal wafers of semiconductor materials using photolithographic mask and etch or ion-bombardment techniques. Typically the wafer contains a large number of semiconductor devices which are fabricated simultaneously. Initially, and at the completion of each step in the semiconductor fabrication process, some residue remains; the kind or type of residue being in part dependent on the stage of fabrication processing, and the wafer surface must be cleaned in preparation for a succeeding step. Depending upon the particular process step in the semiconductor device fabrication process being completed, the completion of a particular process step may incidentally also produce particulate debris, organic contaminants and/or unwanted pieces of thin film metallization layers on the surface of the semiconductor wafer. The residue, particulate debris, organic contaminants and metal pieces must be removed before proceeding with the next step in the fabrication process.

Mass produced semiconductors typically employ silicon technology and cleaning equipment exists to handle such mass production. Such cleaning equipment, however, is unsuited to semiconductors that use the III–V compounds identified in the Periodic Table of the Elements, such as InP and GaAs. First, cleaning solvents used for cleaning silicon wafers are either strong acids or strong bases, which are very harsh chemicals inappropriate for InP and GaAs wafers and produces a lower overall cleanliness. As an advantage, the present invention avoids harsh chemicals detrimental to the wafer. Second, the semiconductor chips produced on silicon wafers are not as fragile as the semiconductor chips fabricated on InP or GaAs wafers. Certain cleaning apparatus designed for cleaning of silicon wafers, such as brush scrubbing, produces structural damage when applied to cleaning of semiconductor devices constructed on InP or GaAs or other compound semiconductor wafers, especially for wafers containing gold metallization layers. As an advantage, the present cleaning system is less harmful mechanically to the semiconductor chips on the wafer.

Accordingly, a principal object of the invention is to clean wafers fabricated of compound semiconductors in a uniform and reproducible manner.

Another object of the invention is to clean Silicon and Germanium wafers or other types of substrates that employ devices or structures the could be damaged by application of conventional cleaning techniques.

A further object of the invention is to minimize and conserve the consumption of solvent and reduce the hazardous waste generated in the semiconductor cleaning process.

A still further object of the invention is to provide a computer controlled wafer cleaning apparatus that assures that each wafer cleaned is cleaned exactly alike.

And still another object of the invention is to provide an automated wafer cleaning apparatus that is relatively inexpensive to build and operate, may be constructed of "off-the-shelf" components, is easy to maintain, and may operate in an essentially unattended manner.

SUMMARY OF THE INVENTION

In accordance with the foregoing objects and advantages, semiconductor wafers are cleaned by moving a hydraulic broom about the surface of the wafer to sweep the wafer clean, the pressurized fluid issuing from the hydraulic broom being of a character that dissolves organic solvents as may be present on the surface of the wafer and produces the mechanical force to dislodge particulate debris from the wafer. In accordance with a specific aspect to the invention, the hydraulic broom is formed of an aspirated sprayer which combines gas released from a pressurized source of gas, suitably nitrogen, through a nozzle and aspirating the cleaning fluid, suitably acetone, through the nozzle into the gas stream providing a source of pressurized cleaning fluid expressed from the nozzle.

The cleaning system is automated. In one embodiment a three-axis positioner, under control of a programmed controller, controls the sweep of the hydraulic broom, moving the broom in a predefined "scanning" pattern over the wafer surface. As an advantage, the pattern of scan may be changed, the number of cleanings of an individual wafer may be changed, and the orientation of the wafer may be changed to permit a surface sweep in an alternate direction. In another embodiment polar movement is employed rotating the wafer while simultaneously continuously pivoting the broom over a predetermined arc about a pivot axis and linearly translating the position of that pivot axis.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE PREFERRED EMBODIMENTS

Figure 1:
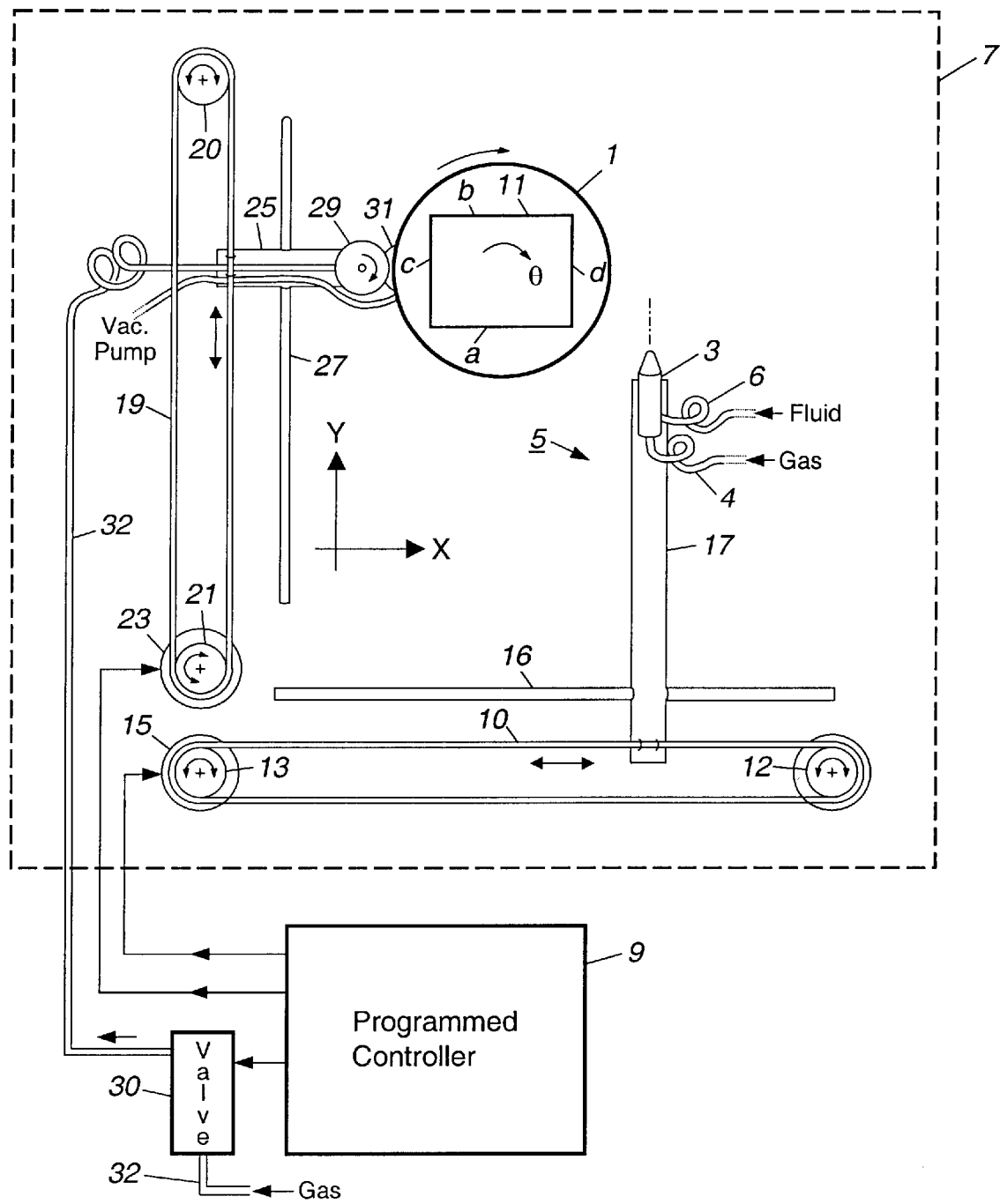
FIG. 1 illustrates a wafer cleaning system in accordance with the invention.

Reference is made to the pictorial illustration of FIG. 1, illustrating a wafer cleaning system constructed in accordance with the invention. The cleaning system includes a vacuum chuck 1 and a fluid nozzle 3 that are coupled, as hereafter described in greater detail, to a three axis positioner 5, X-axis, Y-axis and theta (rotation) axis positioning, all of which components are contained within a housing 7, represented by dash lines, and a programmed controller 9 that controls operation of the positioner.

A semiconductor wafer 11, represented as having a rectangular geometry is illustrated seated upon chuck 1, for the purpose of assisting in the description of operation, later herein presented, it being understood that the wafer is not a component of the apparatus, but is to be acted upon by the apparatus. For purposes of discussion the sides of the wafer labeled "a" and "b" are designated as the front and back edges of the wafer, respectively, and the sides labeled "c" and "d" are designated as the left and right side edges, respectively, of the wafer. The foregoing designation is arbitrary and is solely for the purpose of providing reference locations helpful in the description of operation of the invention.

Positioner 5 is controlled by a programmed controller 9, which may be a micro-controller that is operated in accordance with a hard-wired program in read-only memory ("ROM") or a general purpose computer programmed with software to carry out the described functions. The positioner is illustrated as a servo-motor driven belt type system for the X and Y axis positioning and a pneumatic stepper motor for theta (rotation).

In such a positioner a continuous loop belt 10 is supported between a pair of pulleys 12 and 13, and the belt is moved by a servo-motor 15 that turns the pulley 13. A bracket 17, which is slip mounted to a straight rail 16, oriented horizontal in the figure, that supports the weight of the bracket, and, in turn, also the weight of the object to be positioned along the X-axis, which is nozzle 3 in this embodiment, is coupled to a position along the belt. When belt 10 moves a predetermined distance, back or forth (along the X-axis), the belt pulls bracket 17, which functions as a traveler, the same distance.

The positioner includes a second continuous loop belt 19 mounted between a pair of pulleys 20 and 21 with the rotational position of pulley 21 being controlled by a second servo-motor 23. A bracket 25, which is slip mounted to a rail 27, vertically oriented in the figure, that supports the weight of the bracket, and, in turn, also the weight of the object to be positioned along the Y-axis, which in this embodiment includes vacuum chuck 1 and some additional elements hereafter described, is coupled to a position along the belt 19. When belt 19 moves a predetermined distance, back or forth (along the Y-axis), the belt pulls bracket 25, which functions as a traveler, the same distance.

The positioner also includes a rotational axis position control for the object that is to be rotationally positioned, here the object being the vacuum chuck 1 (and any wafer 11 that may be held by the chuck). The rotational or, as variously termed θ, positioning is represented in the figure by a pneumatic stepper motor 29, also controlled by controller 9 via an electric gas valve 30, and a gear 31 that engages the gear teeth, not illustrated, of a rotational table, not illustrated, that supports vacuum chuck 1. Stepper motor 29, the gear and rotational table are also supported and carried by bracket 25. A flexible gas hose extends from valve 30 to the stepper motor.

Valve 30 connects via a gas line 32 to a source of pressurized gas, not illustrated, suitably the same gas source as is used for nozzle 3, as later herein described. Controller 9 connects to gas valve 30 via electrical leads. The controller controls the opening and closing of gas valve 30, and, hence, the supply of pressurized gas to operate stepper motor 29.

Controller 9 thus controls the X-axis position of nozzle 3 and the Y-position and angular position of vacuum chuck 1 by supplying the appropriate signals to each of the servo-motors and pneumatic stepper motor in accordance with the program that the controller is to follow. As those skilled in the art appreciate, computer controlled positioners of the foregoing type are available off-the-shelf and may be adapted for use in the practice of the invention.

Further, although the foregoing embodiment employs a belt-pulley arrangement other types of positioners are available that employ worm screw type arrangements instead. However, with any such positioner care must be taken to avoid any structure that could generate A spark, since the environment is volatile and flammable. As is appreciated, the invention may incorporate any type of three-axis programmable computer controlled positioner.

Nozzle 3 is an aspirating nozzle. The nozzle is connected by a flexible gas hose 4 to a source of pressurized gas, not illustrated, such as nitrogen. The nozzle is also connected by a flexible fluid hose 6 to a reservoir or source of solvent fluid, not illustrated, such as acetone, which is preferred. The bracket 17 supports the nozzle at a vertical elevation above the surface of wafer 11, with the latter is seated on chuck 1. The height of the nozzle, i.e. The Z-axis position, is preferably manually adjustable (as later herein described in greater detail), and is adjusted to be at a higher elevation than the vacuum chuck 1 and any installed wafer 11. Additionally, the nozzle is positioned with the nozzle axis inclined to the surface of the vacuum chuck 1 and, hence, is inclined to the surface of the wafer 11 that is to be installed and cleaned.

For operation, wafer 11 is seated on the vacuum chuck 1 in housing 7 with the front edge of the wafer aligned with the X-axis, parallel to rail 19, and the vacuum source, not illustrated is connected to the chuck to hold the wafer in place. Controller initializes and positions the end of nozzle 3 at the reference 0,0 position set by the designer of the controller program, as example, at the lower left corner of wafer 11 in FIG. 1 or, with an aspirating sprayer as in the preferred embodiment, just below the lower left corner of the wafer.

In an aspirating nozzle, such as nozzle 3, a high velocity stream of gas flows past a fluid inlet in the nozzle and out the nozzle exit. With the fluid inlet connected to a source of fluid, the streaming gas lowers the pressure over the inlet and fluid is forced up through the inlet, and into the stream of gas, the known phenomena of aspiration. The aspirated fluid then travels with essentially the same velocity and pressure as the gas, and out the nozzle exit. The volume or rate at which the fluid is drawn up may be adjusted by adjusting the size of the inlet, which may be accomplished manually. With both the solvent fluid and the source of gas connected to the nozzle, the nozzle expresses an aspirated spray of fluid, hereafter sometimes referred to as a fluid jet. Initially, the output of the nozzle is gas, but quickly aspirates the solvent fluid. Hence, except where noted to the contrary the fluid jet is understood to contain both solvent fluid and the gas.

Because the nozzle being used in the preferred embodiment is an aspirating type nozzle, that which exits from the nozzle when the system initially is operated is a blast of the aspirating gas. After a few moments the fluid solvent is drawn up and the fluid jet is then expressed from the nozzle. To avoid having the initial gas jet directed onto the wafer surface for reasons later discussed, it is preferred to make the first steps of the spray pattern, namely the first left to right movement (horizontal movement in the figure), be directed slightly in front of the bottom edge of wafer 11 so that the gas stream does not impact the wafer surface. Additionally, an anti-siphon valve may be incorporated in the system to reduce fluid depletion when the system is idle.

Figure 2:
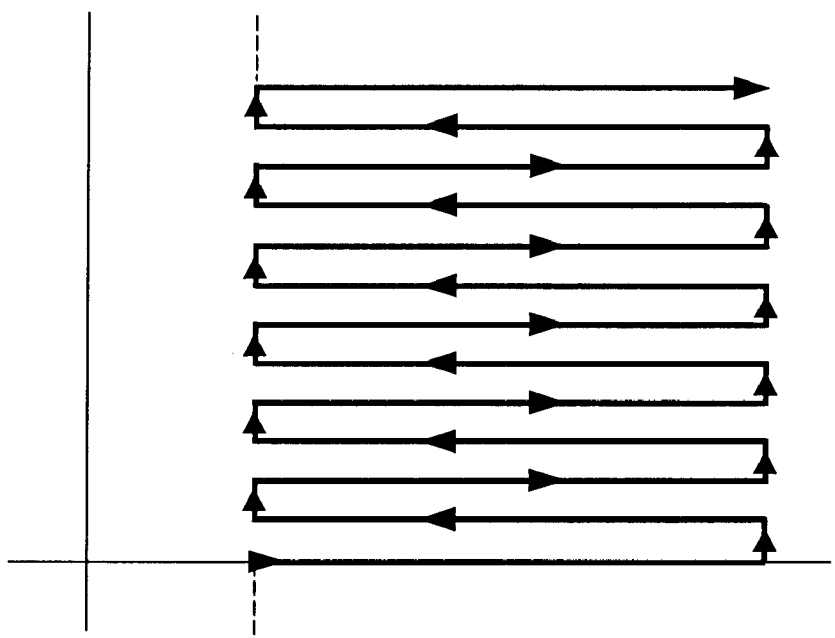
FIG. 2 illustrates a preferred routing program of the relative movement of the wafer and spray nozzle elements in the operation of the embodiment of FIG. 1.

The controller is programmed to move the relative position of the nozzle and wafer in accordance with the pattern of FIG. 2 to which reference is made. As shown in the figure, the nozzle is to follow a path from left to right directing a fluid jet onto the wafer as the nozzle moves. When the right side of the wafer is reached (or thereafter), the direction of the nozzle movement is reversed and, simultaneously, the relative vertical position from the bottom edge of the wafer is increased one small increment. The nozzle then moves from right to left spraying solvent fluid and gas at the wafer along a horizontal path parallel to the prior path taken.

When the left side edge of the wafer is reached (or thereafter), the direction of movement of the nozzle is again reversed, moving from left to right, and the vertical level, the distance from the front edge of the wafer, is again increased by an increment. The foregoing movement is repeated as many times as is necessary for the jet of solvent fluid to at least reach the upper right back corner of the back edge of the wafer (and may extend beyond that horizontal position) at which position wafer cleaning may conclude (or as later herein described be put through additional cleaning). Programming the controller to accomplish the foregoing pattern (and any other desired pattern) of movement is elementary to those skilled in the programming arts, the details of which are not necessary to an understanding of the invention.

Returning to FIG. 1, as thus programmed, during initialization of the positioning system, the controller supplies the appropriate signal to valve 30 releasing a sufficient number of gas pulses to stepper motor 29 to ensure that the stepper motor positions the zero degree rotational orientation of vacuum chuck 1 to the zero or reference position, if not already at that rotational position.

Controller 9 supplies a signal to servo-motor 15 that moves belt 11 to the left, and, hence, bracket 17 and nozzle 3, so that the nozzle axis lines up with the left side, side "c" of the wafer, the zero X-reference position. Controller 9 also supplies a signal to servo-motor 21 that moves the belt 19, and, hence, bracket 25 and vacuum chuck 1, forward in the figure, so that the front edge "a" of wafer 11 aligns with the Y-axis zero reference position. At that reference position, the fluid jet issuing from the elevated end of nozzle 3 strikes the surface of the wafer at a position just in front of the front edge of the wafer, for reasons earlier discussed. With other types of sprayers, the position of the strike would be at the front edge. As a practical matter, the distance is at most a minute distance from the front exit end of nozzle 3, and, one may state (with acceptable slight inaccuracy) that the front end of the nozzle 3 essentially lies on the Y-axis zero reference position.

The controller then starts the sweeping procedure, supplying positioning information to move the nozzle 3 from the left to the right side edge of the wafer. When the right side edge is reached, the controller supplies a signal to the Y-axis servo motor 29 to move the vacuum chuck 1 a predetermined small increment downward (in the figure), placing the end of nozzle 3, as example, a small distance above the front edge of the wafer; and the controller thereafter supplies signals to the X-axis servo-motor 13 to continuously move the nozzle parallel to the X-axis to the left. When the nozzle moves to at least the left edge, the controller again operates the Y-axis servo motor to move the chuck downward (in the figure) an additional increment and reverses the direction of travel of nozzle 3, which proceeds from left to right. The foregoing operation continues until the fluid jet from the nozzle reaches at least the upper right hand corner of wafer 11. In the foregoing manner the fluid jet from the nozzle is applied to the surface of the wafer from side to side and from front to back of the wafer, covering the entire surface of the wafer.

As earlier noted, the axis of nozzle 3 is inclined to the surface of the wafer 11 and vacuum chuck 1, while the nozzle is elevated slightly above the surface of the wafer. The incline may at an angle selected from a range of about twenty degrees to seventy degrees. The aspirated spray of solvent fluid is expressed from the nozzle under considerable pressure, the pressure of the aspirating gas stream, and at a high velocity. The fluid jet strikes the surface of the wafer askance with considerable impact. Should a particle (or particles) be present on the surface and be struck by the fluid jet, the fluid exerts a force sufficient to push the particle (or multiple particles) forward along the surface of the wafer. The particles are pushed forward in the same direction as the nozzle travels relative to the surface of the wafer and, hence, the fluid jet. Hence, as the nozzle continues movement toward the back edge of the wafer in the line by line movement, the particles as may have accumulated on the disk (and not pushed off) are pushed further forward by force of the jet. As the nozzle moves along the back edge of the wafer, any accumulated are eventually pushed off the back edge of the wafer and fall onto the vacuum chuck and/or to the bottom of housing 7.

In pushing particles forward, the nozzle, in effect acts as a broom, albeit, a hydraulic one. By routing the hydraulic broom over the surface, the broom sweeps the surface of the wafer. The foregoing action resembles the process used by one to sweep fallen leaves from one's home driveway by "hosing down", cleaning, one's driveway with a stream of water from the garden hose, another hydraulic broom.

If desired, the controller may be programmed to have the hydraulic broom travel a predetermined distance beyond the side edges of the wafer and/or the front and back edges of the wafer. Although doing so perhaps somewhat simplifies the programming of the controller, the extra movement beyond the edges of the wafer serves no purpose and is not preferred. The extra movement increases the time taken to sweep the wafer. Such extra relative movement of nozzle 3 delays the cleaning of the next wafer to be cleaned and thereby delays production.

As those skilled in the art appreciate, the spray of fluid solvent creates a considerable amount of splashing upon striking the wafer surface. The splashed fluid, however, is confined within housing 7, and serves to clean particles from the exposed portions of the vacuum chuck not covered by the wafer, and washes down to the bottom of the housing.

Figure 3:
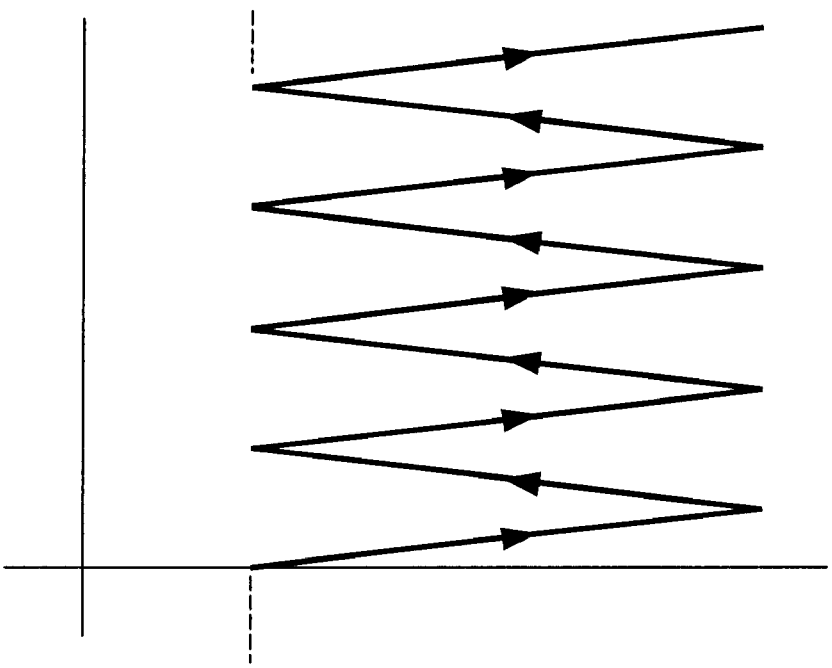
FIG. 3 illustrates another less preferred routing of the relative movement of the wafer and nozzle elements in the embodiment of FIG. 1.

The foregoing programming of controller 9 to accomplish the routing of nozzle 3 relative to the surface of the wafer during cleaning is a preferred routing. Other routing may be substituted in the practice of the invention, even if that routing is less preferred. As example, the controller may be programmed to route the nozzle in the zig-zag pattern illustrated in FIG. 3 to which reference is made. In order to follow the zig-zag path the nozzle must be moved not only along the X-axis, but simultaneously along the Y-axis as well. Returning to FIG. 1, for the foregoing zig-zag routing, controller 9 supplies signals to both servo-motor 15, which drives the nozzle movement along the X-axis concurrently with servo-motor 23, which drives the vacuum chuck along the Y-axis (or as alternatively viewed moves nozzle 3 in the Y-direction relative to chuck 1), but at a lesser incremental movement.

In the preceding discussion, wafer 11 has been described implicitly as having a relatively flat surface, which is accurate as viewed on a macroscopic level. On the microscopic level however, the surface of the wafer during fabrication of semiconductor chips acquires a definite topology of some regions that are vertically higher than other regions. Fabrication of the chips on the wafer involves producing multiple layers of metals, and differently doped layers of semiconductor materials, which is accomplished in multiple fabrication steps. Upon completion of each step, the wafer must be cleaned before beginning the next step or stage of fabrication. In the later stages of chip manufacture, the surface of the wafer contains a definite topology.

When cleaning the wafer in the later stages of semiconductor chip fabrication, a possibility exists that the fluid jet will be unable to force a microscopic size particle up over an adjacent a microscopic size "wall" or may press the particle against that wall when that wall lies perpendicular to the direction of the solvent fluid jet from nozzle 3. Hence, despite the foregoing cleaning, the wafer may retain some particles and thereby remain unclean. By reorienting the wafer to another angle, such as by reorienting the wafer by ninety degrees, the foregoing wall will then lie parallel to the direction of the fluid jet. In that orientation, the fluid jet will easily push the particle forward alongside the wall.

As an additional feature, the present invention provides for rotating the wafer to another angular position so as to minimize or avoid retaining microscopic particles due to the foregoing microscopic walls in the wafer. Reference is again made to FIG. 1. During the described line-by-line cleaning operation, the forward edge "a" of the wafer is located at a lower horizontal position in the figure than the rear edge "b" and nozzle 3 essentially traveled from the lower left corner of wafer 11 to the upper right corner of the wafer.

When controller 9 determines that the wafer cleaning procedure is completed, that is, according to the tracking of the program by the computer (in lieu of active position monitoring) nozzle 3 should essentially be located at the upper right corner of the wafer (formed at the juncture of sides "b" and "d" in the figure), controller 9 supplies appropriate signals to electrically operated gas valve 30, which in turn, supplies gas pulses to the theta pneumatic stepper motor 29, commanding the stepper motor 29 to rotate clockwise, as example, by an angle of ninety degrees. Stepper motor 29 then rotates the vacuum chuck 1 about the axis of the chuck by ninety degrees. Since wafer 11 is positioned with the axis of the wafer coaxial with the axis of the chuck, the wafer is reoriented so that side "d" is now the lower most horizontal edge, a forward side to the wafer, and side "a" is positioned, vertically in the figure, as a left side edge of the wafer, replacing side "c" in that position.

Concurrently, controller 9, operating servo-motors 15 and 23, repositions the vacuum chuck 1 and the nozzle 3 (as in the initialization procedure earlier described) so that the fluid jet from the nozzle is again directed at the lower left corner of the repositioned wafer 11 and repeats the cleaning process which was earlier described and need not be repeated.

Although the foregoing embodiment rotationally repositions wafer 11 only once and by ninety degrees, as is recognized by those skilled in the art, controller 9 may in alternate embodiments be programmed to rotate the wafer by any other angle several times, repeating the cleaning process each time. As example the program may call for rotating the wafer by an increment of 45 degrees each time the cleaning process is completed, re-run the cleaning process and to perform such rotations and re-run the cleaning process two additional times, a total of 135 degrees, before concluding the cleaning procedure for the wafer. Although such a program is within the scope of the invention, the alternative programs are less preferred as they require additional time for cleaning and, thus slow down the semiconductor fabrication process and appear to go beyond the point of diminishing return in cleaning.

In the foregoing embodiment the rotation of the vacuum chuck was controlled by a pneumatic motor 29. It is appreciated that other means may be substituted for that type of motor, as example, a brushless electric motor, such as a servo-motor, such as used for motors 15 and 23.

On concluding the cleaning of a wafer, the controller halts the operation and extends the water chuck beyond the housing so that the cleaned wafer may be removed. Another wafer may be loaded for cleaning by aligning the wafer in the chuck so that the axis of the wafer is preferably aligned with the chuck axis and an edge of the wafer is aligned with the Y-axis traveled by nozzle 3.

Figure 4:
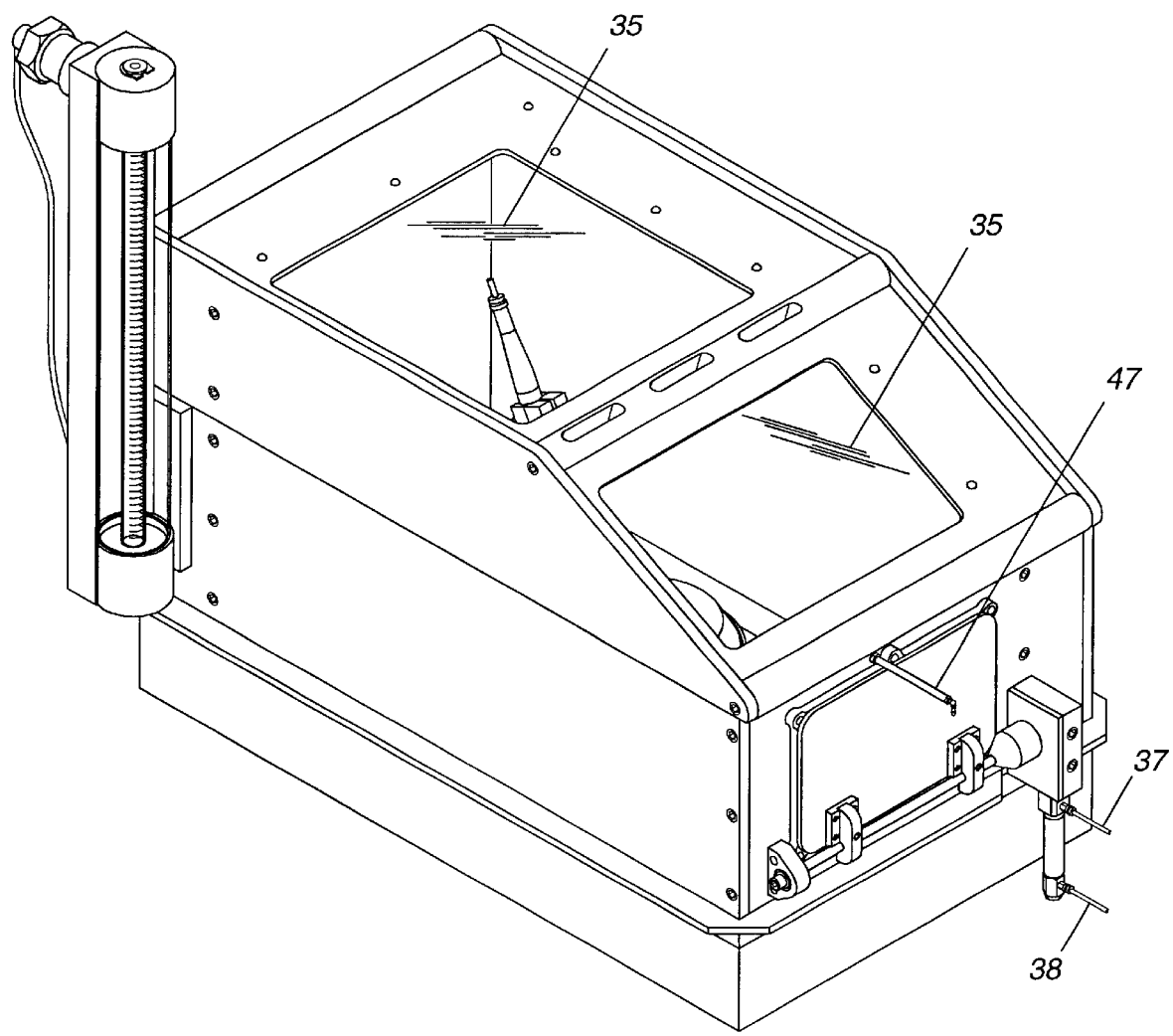
FIG. 4 is a spray box that houses the principal components of the cleaning system, depicted in a left perspective view
Figure 5:
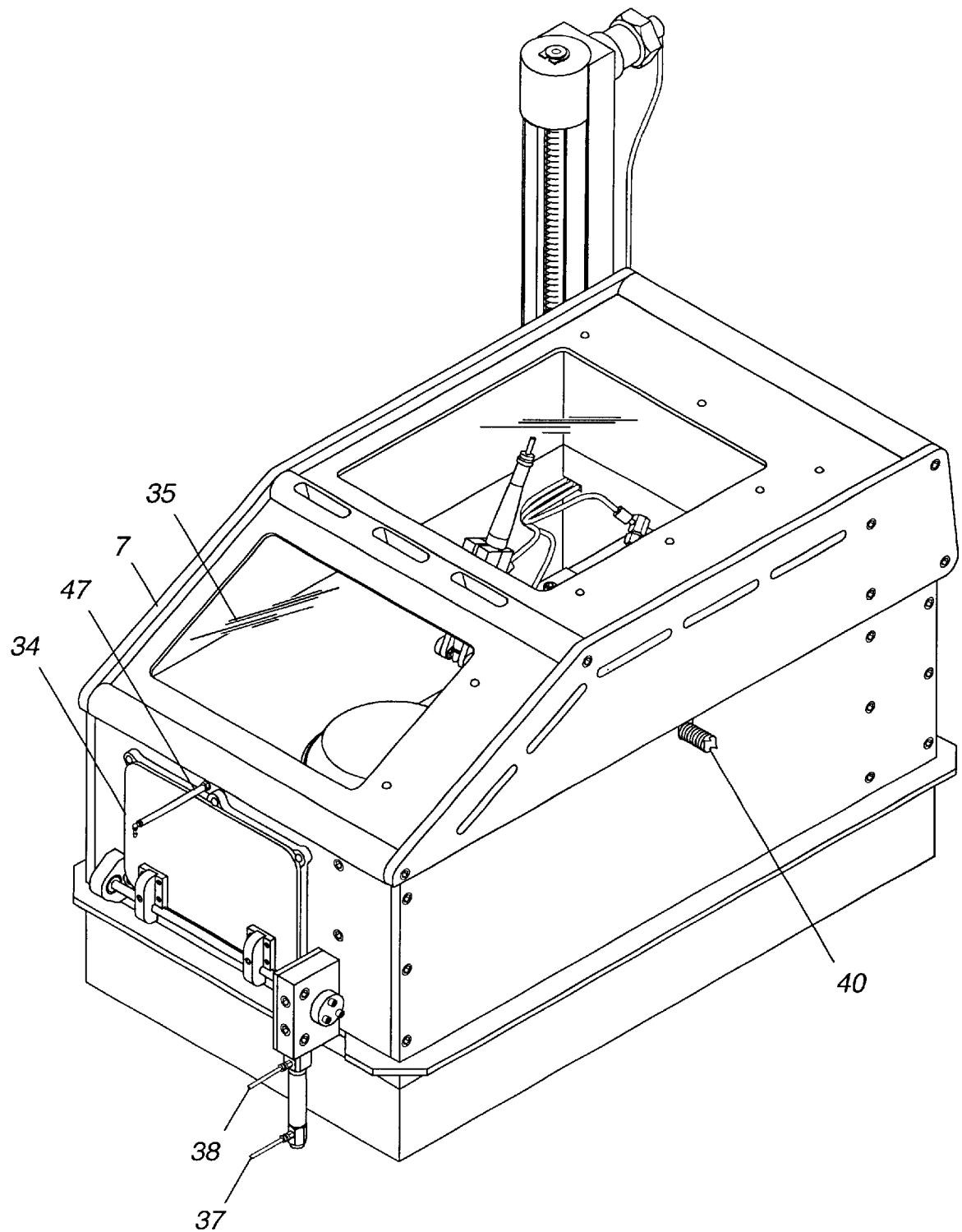
FIG. 5 is a right perspective view of the spray box of FIG. 4.

The foregoing structure and additional structure as may be included in a practical embodiment of the invention is next considered. For convenience the denominations used to identify components in the embodiment which follows are the same that were used in connection with the same components found in the embodiment of FIG. 1. Reference is made to FIGS. 4 and 5 which illustrate housing 7. The housing includes a bottom hinged front door 34, which pivots open like an oven door, to provide access, and, above the door, a glass or transparent plastic window 35, through which personnel may view the wafer during the cleaning operation. Preferably, the door is pneumatically operated under control of the programmed controller.

Hose 37 supplies pressurized nitrogen to open hinged door 34 and hose 38 supplies pressurized nitrogen to close that door. Hose 36 supplies acetone to the external drip 47, which is attached to the enclosure. Hose 39 attaches to an appropriate exhaust vent, not illustrated, at the rear of the housing, and connects to the facility gas exhaust system, which typically may be a thermal oxidizer for solvent use or a fume exhaust for a non-solvent use. The shielded electrical conduit 40 is the electrical signal interface from the controller 9 to the x-axis stepper motor. Hose 41 supplies pressurized nitrogen to purge or vent the plenum in which the brushless X and Y-axis stepper motors are located. The housing may be fabricated of stainless steel or aluminum. Automated wafer cleaning is accomplished inside the housing, which contains the splashing of the solvent fluid to the closed internal region of the housing.

Figure 6:
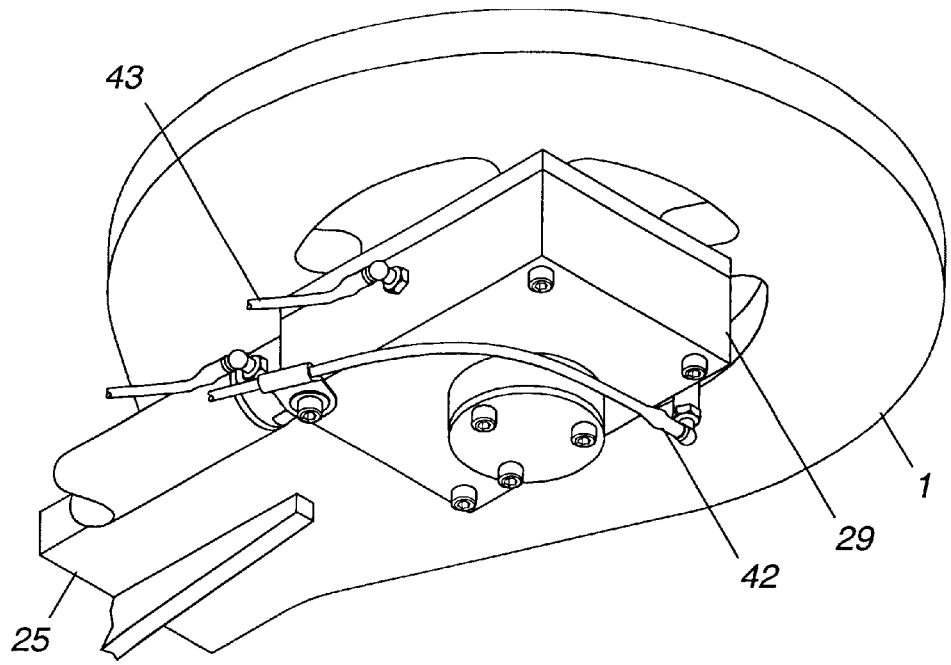
FIG. 6 illustrates a vacuum chuck component of the invention used to hold a wafer, shown from the left side in a withdrawn position from the housing.
Figure 7:
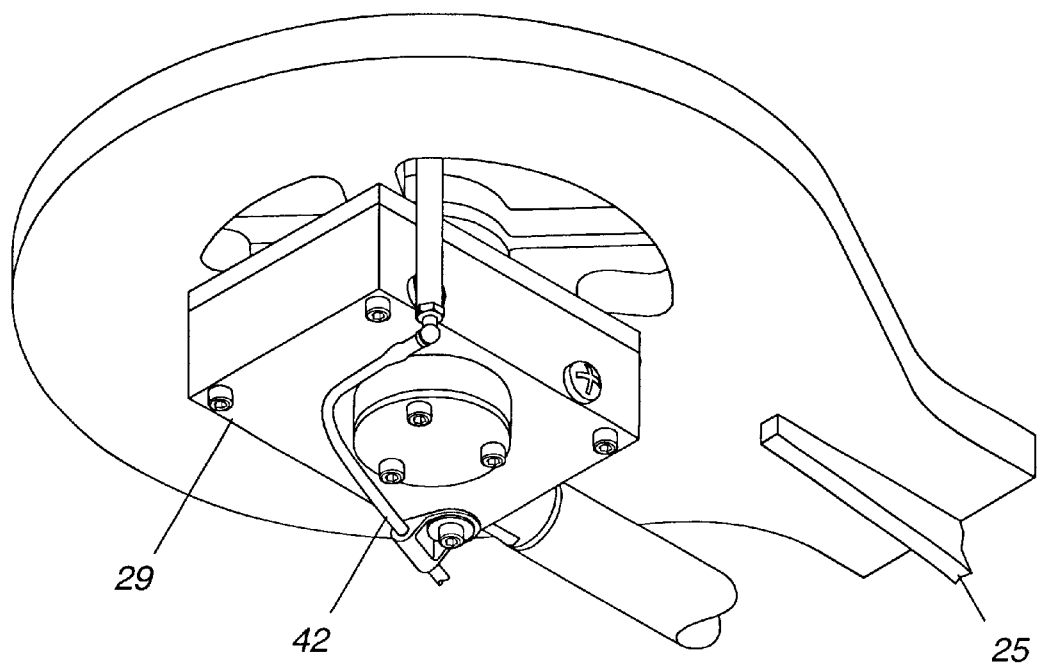
FIG. 7 illustrates the vacuum chuck component of FIG. 6 from the right side.

FIGS. 6 and 7 illustrate vacuum chuck 1 from the left and right sides, respectively, in a position withdrawn from housing 7 for insertion or removal of a wafer. Conveniently, when door 34 is automatically lowered, as later herein described, the vacuum chuck is advanced forward out of housing 7 to the illustrated "home" position. Hose 42 is the vacuum hose that supplies the suction on the upper surface that holds the wafer in place. Hose 43 is the gas hose to the pneumatic stepper motor, not visible in the figure. The outer surface of stepper motor 29 and bracket 25 are more visible in FIG. 7.

Figure 9:
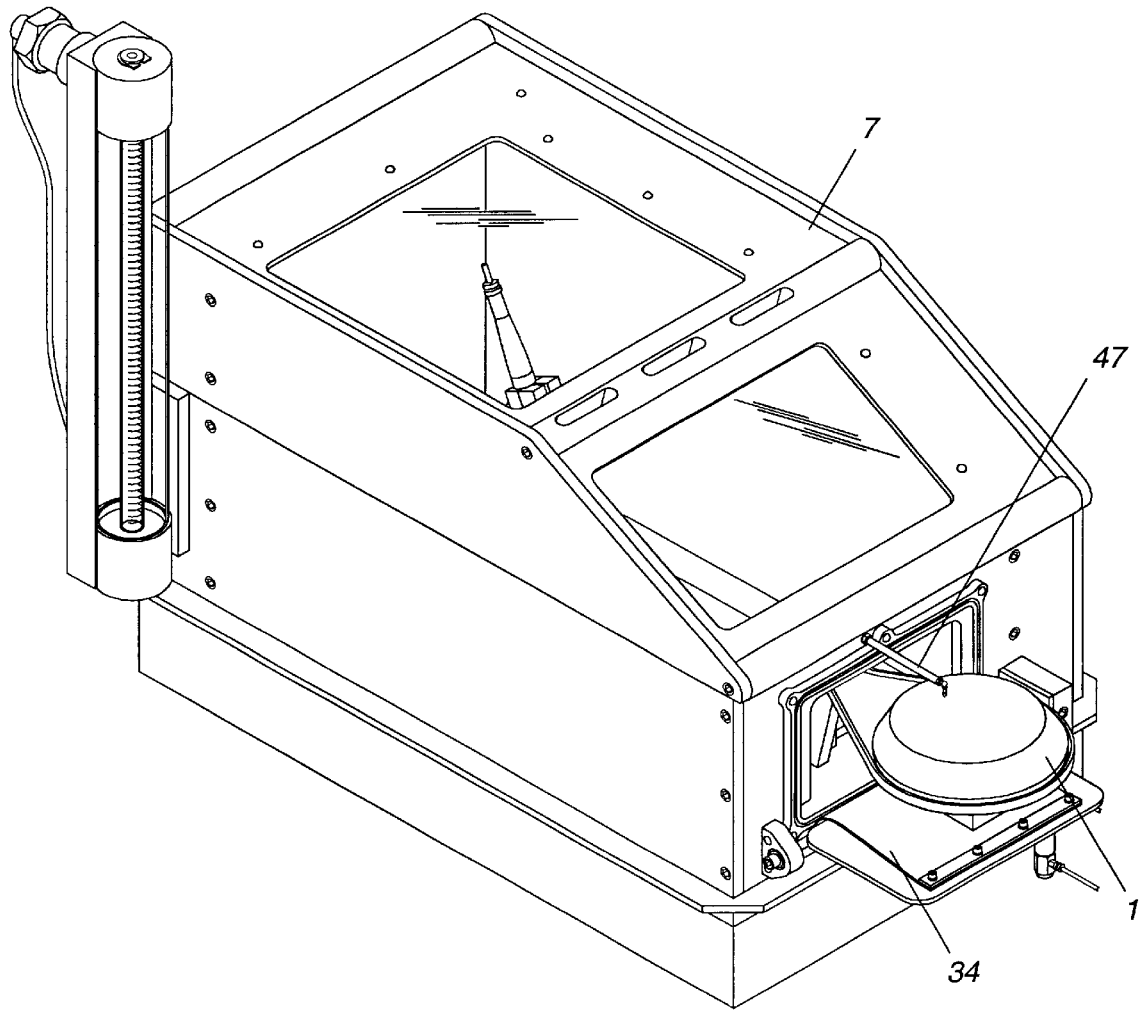
FIG. 9 shows the aspirating nozzle element of the system.

The vacuum chuck is seen in a top perspective view in FIG. 9 to which reference is made. A conduit 47 is shown attached to the front of housing 7. The conduit contains an open end positioned over the center of the surface of the vacuum chuck, when the latter is in the extended position shown in the figure. The conduit connects to a pressurized reservoir of the acetone cleaning fluid supplied in a common acetone distribution manifold as may be located immediately behind the enclosure. The conduit is calibrated to drip acetone fluid onto the vacuum chuck and/or wafer placed on the chuck and is referred to as the external acetone drip. The cleaning fluid keeps the organic contaminants on the wafer from drying, which would make those contaminants more difficult to remove in the cleaning process.

Figure 8:
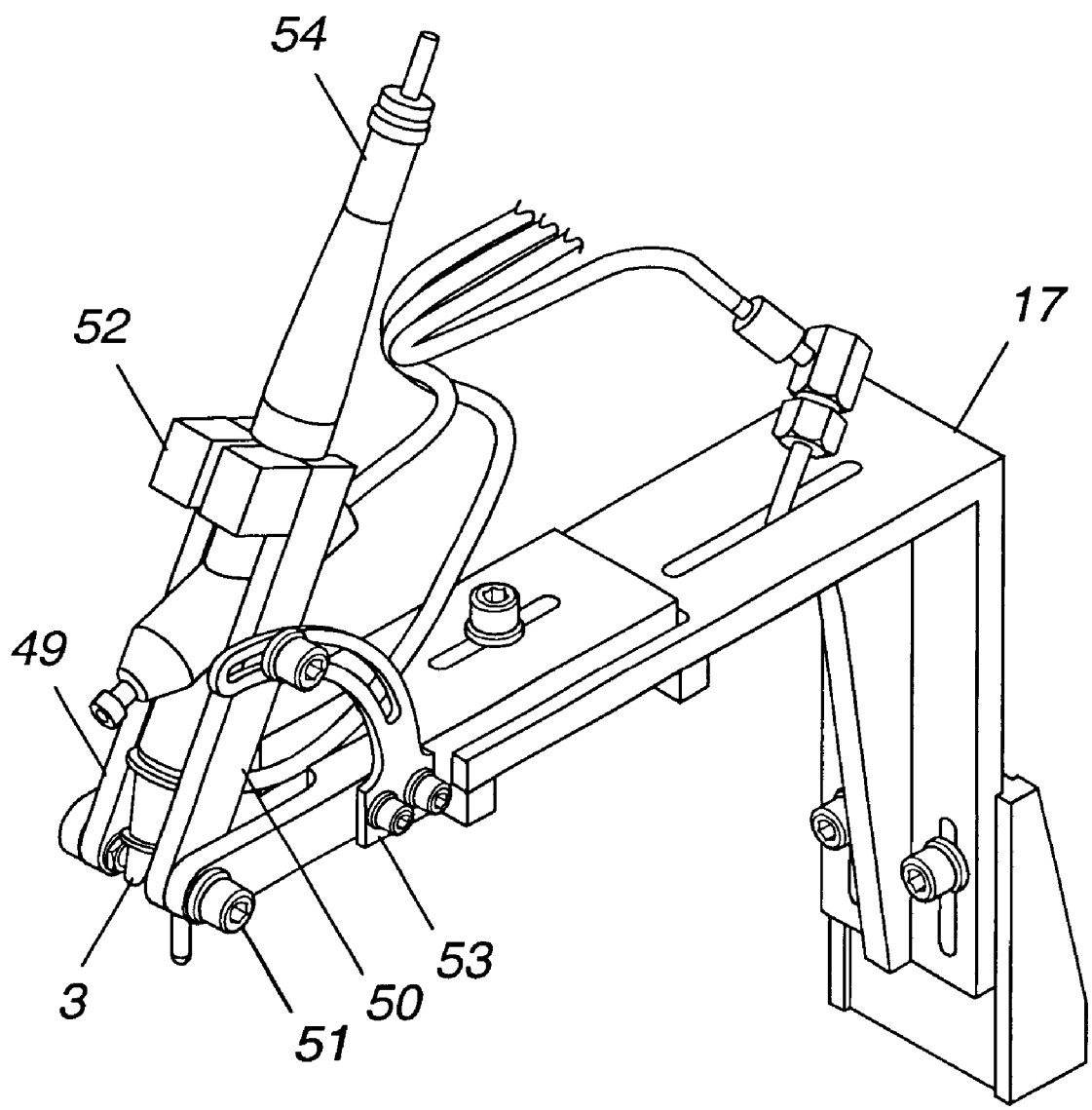
FIG. 8 illustrates the foregoing spray box of FIG. 4 and the vacuum chuck of FIG. 6 in a front view with the vacuum chuck extending through the door way of the spray box.
Figure 10:
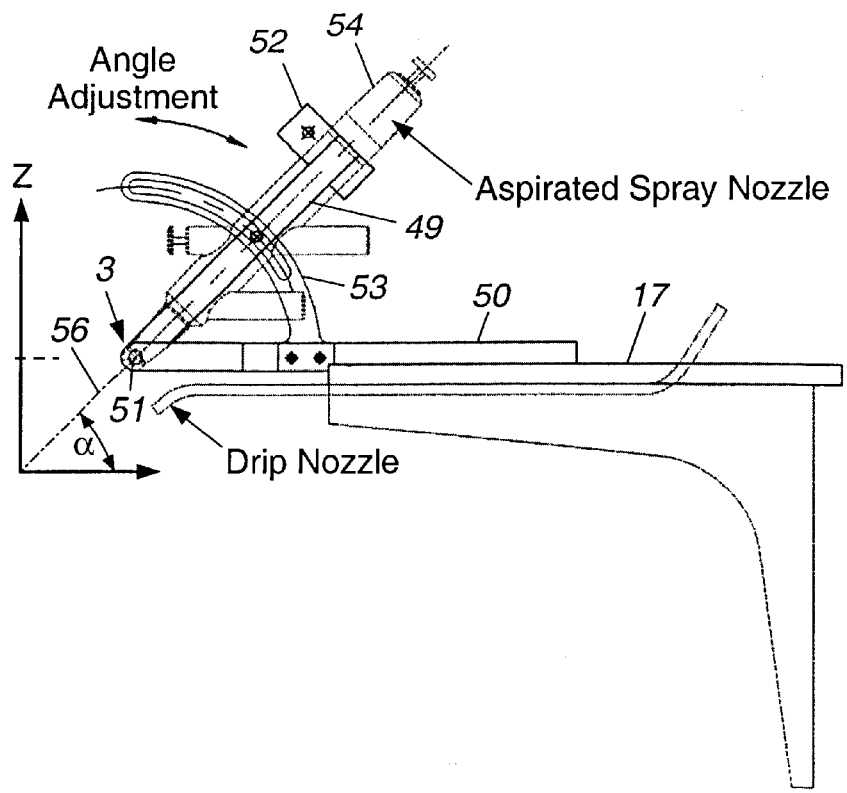
FIG. 10 is a side view of the aspirating nozzle of FIG. 9 and the associated support structure.

FIGS. 8 and 10 illustrate the spray apparatus in perspective and in side view, respectively. Nozzle 3 is supported to the inverted "L" shaped bracket 17 by adjustment brackets 49 and 50. The bracket arms 49 are pivotally connected together at pivot axis 51. The nozzle is clamped between the two arms by clamping members 52 attached to the upper end of the arms 49. As illustrated, the nozzle 3 contains a long generally cylindrical body. The upper end contains a valve mechanism 54 that permits manually adjusting the force of the fluid spray or jets that issue from the opening at the lower end. Nozzles of the foregoing type are available from various sources as an off-the-shelf item. Bracket arm 50 contains a slotted upwardly extending curved guide arm 53. The curved slot is a sector of a circle. Arm 49 is pivoted to the appropriate angle desired relative to the horizontal, suitably between about twenty to seventy degrees in the preferred embodiment, and the arm 49 is secured to that position of the guide arm 53 by tightening a bolt and nut through the slot. The nozzle may be moved along the nozzle axis 56 either forward or backward prior to tightening the clamping members 52 to either reduce or increase the distance from the nozzle end to the surface of the vacuum chuck, hence, to the wafer. The foregoing constitutes a manual Z-axis adjustment.

Figure 11:
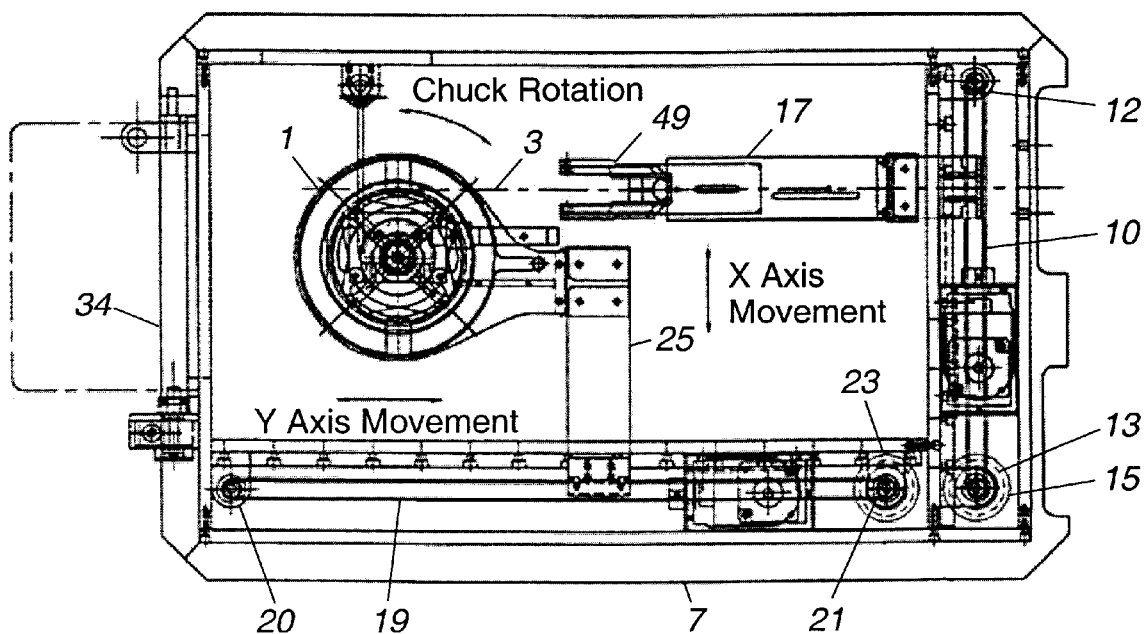
FIG. 11 partially illustrates the wafer cleaning system in a top view overall with the walls of the spray box being treated as transparent.
Figure 12:
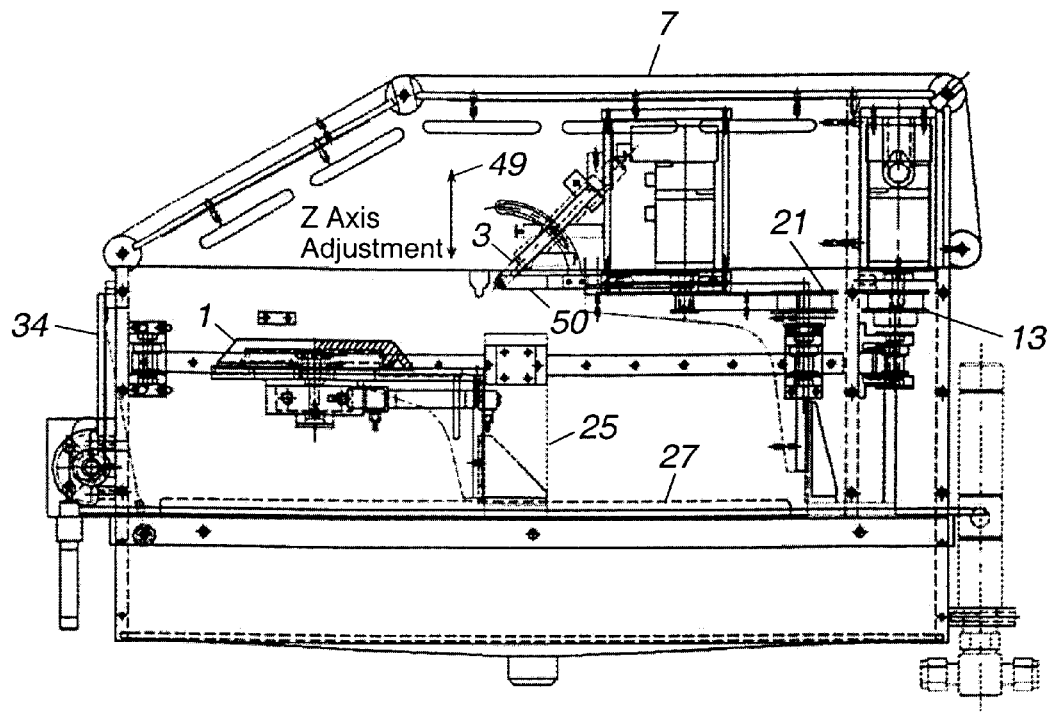
FIG. 12 partially illustrates the wafer cleaning system of FIG. 11 in side view.
Figure 13:
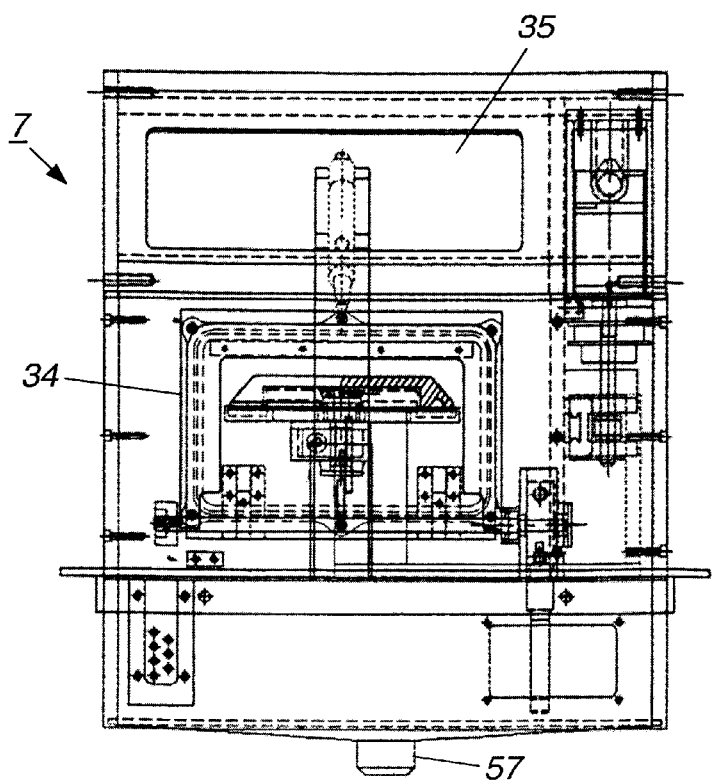
FIG. 13 partially illustrates the wafer cleaning system of FIG. 11 in front view.

FIG. 11 illustrates the wafer cleaning system in a top view; FIG. 12 illustrates that system in side view and FIG. 13 is a front view of the wafer cleaning system. In the latter three illustrations the housing is rendered as transparent with the outline of the housing elements illustrated in order to permit view of the internal components. All of the elements earlier described contain the same denomination as in the previous figures.

In FIG. 13 a drain 57 is included on the bottom of the housing. The drain is connected to an appropriate solvent collection tank in the facility. All of the particles removed, and dissolved organic material and acetone fluid during cleaning is removed from the housing assembly through that drain.

Figure 14:
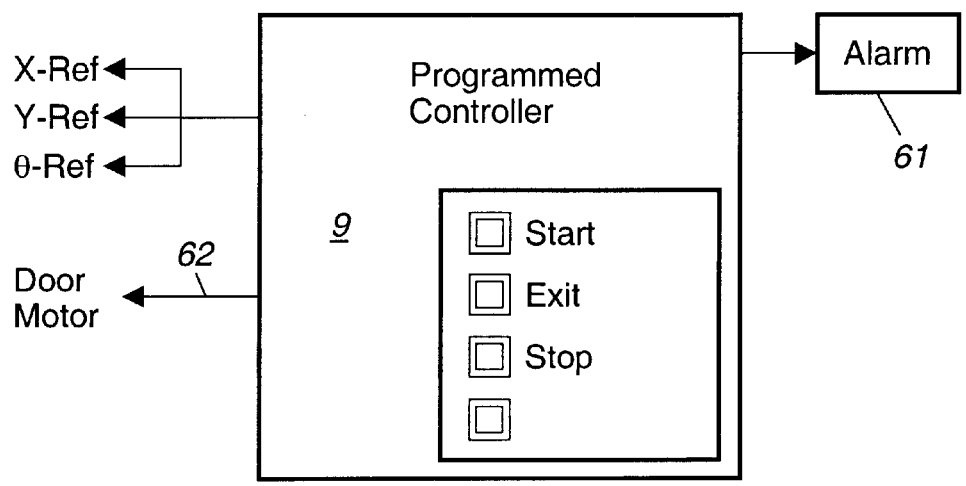
FIG. 14 is a block diagram of the additional controls employed in the practical embodiment of FIGS. 4–13.

As an added feature, the door 34 to housing 7 is controlled by a pneumatic motor, not illustrated. Reference is made to FIG. 14 which is a block diagram of the control circuit and additional apparatus for this feature. As shown the programmed controller 9 incorporates an operator selection key pad. To start the operation the operator need only momentarily depress the start switch associated with the cleaning program that is to be run (only one being illustrated in the figure). At the conclusion of cleaning the controller is programmed to output a perceptible signal to personnel as at alarm 61. Responding to that signal the personnel, would then depress the exit key. The controller is programmed to respond to the depression of the exit key by issuing a signal to the door motor to open the door. Door 34 then opens, such as was illustrated in FIGS. 6–8. The controller is also programmed to follow the door opening to move the vacuum chuck 1 to an extended position outside the housing as shown in the cited figures by supplying the appropriate signal to the Y axis servo-motor. Referring to the top view of FIG. 11, one may observe that the belt 19 and rail in the Y-axis direction extends to the front of the housing. By advancing the belt so that bracket 25 moves to the far left in the figure, the vacuum chuck, located on a foot of the L-shaped bracket will extend out of the housing. Lastly, the stop button permits the operator to halt the cleaning at any time at the operator's discretion.

In like manner, the cleaning system may be programmed to permit the depression of the start button to initialize from the open door position just described. The operator may remove the cleaned wafer and install another wafer on the vacuum chuck. In the initialization procedure following depression of the start program, the controller may be programmed to move the vacuum chuck inside the housing 7, and then relatively move the nozzle and chuck as earlier described in this specification. The controller would then issue a signal to the door motor to close the door. Cleaning would then commence.

In the practical embodiment, the nozzle 3 is placed about one to five centimeters above the surface of the wafer; the axis of the nozzle is inclined at an angle of about 20 to 70 degrees to the surface of wafer 11, as example, forty-five degrees. The fluid solvent expressed through nozzle 3 in the axial direction of the nozzle is under a pressure of about 20 to 100 psi.

Acetone is a preferred solvent for cleaning of wafers, even though the fluid is flammable and in the vapors found in the operation could be explosive. However, as is apparent from the description, the system avoids any component that might produce a spark. The system includes brushless motors, the servomotors, which do not contain any brushes which are likely to produce sparks. The plenum in which those motors are located is purged with nitrogen supplied through hose 41. The system also includes a pneumatically operated stepper motor. Lastly, the atmosphere within housing 7 is ventilated to an external ventilation system that draws off and disposes of any vapors harmlessly.

Although the invention has been described in connection with a rectangular wafer, as one appreciates, the invention is not limited to cleaning of wafers that are of a square or rectangular shape. As those skilled in the art recognize the invention is capable of cleaning wafers that may be of any shape. As example, assuming that the wafer is of circular or elliptical in shape, however unlikely it may be for one to design such a wafer, the closest portion or point of the periphery of the wafer that is at the lowest vertical position in the figure should be regarded as the front edge; and that portion or point at the highest vertical position in the figure should be regarded as the back edge or side of the wafer; and likewise the left side edge would be the point or portion of the periphery of the wafer located at the horizontal position in the figure located closest to the left edge of the sheet; and the right side edge would be the point or portion of the periphery of the wafer located farthest horizontal position from the left edge of the sheet. As is apparent, the relative movement between the nozzle and the wafer provides a scan or sweep of the entire surface of such a circular or elliptical shaped wafer in the same manner as occurs with the rectangular shaped wafer.

From the foregoing description, one recognizes that the movement of the hydraulic broom is relative movement. In the foregoing embodiment, the chuck carrying the wafer, and, hence, the wafer is moved in one axial direction and the nozzle is moved in an orthogonal direction to produce the "sweeping" action of the nozzle in the X-Y plane over the entire surface of the wafer. As those skilled in the art appreciate, in other embodiments it is possible to retain the nozzle stationary and move the wafer in both the X and Y axial directions or, alternatively, hold the wafer stationary and move the nozzle spray in both the X and Y axial directions over the X-Y plane of the surface of the wafer to produce the "sweeping" action of the nozzle in the X-Y plane over the entire surface of the wafer. From the standpoint of one standing on the surface of the wafer, the person would observe the nozzle moving over the X-Y plane in each case. Each such embodiments falls within the scope of the present invention. Thus it should be understood that the term "moving" the nozzle (or, as variously termed, the hydraulic broom) over the surface of the wafer is intended to mean relative movement as viewed from the perspective of the wafer as a convenient reference location.

Further, as those skilled in the art appreciate, the foregoing interpretation of movement of the nozzle (or, as variously termed, the hydraulic broom) over the surface of the wafer is equivalent to moving the wafer in the axial X and Y directions across the nozzle exit. The latter is simply a change in perspective taken from the standpoint of an observer placed on the nozzle who would view the movement of the wafer thinking that the nozzle is stationary. The physical effect is the same. The foregoing falls within the scope of the present invention, which is independent of the point of view one may take to describe the invention. The description herein and in the claims which follow of necessity are expressed in terms taken from a point of view, and that point of view is from the surface of the wafer. That necessity of language is not intended to restrict the scope of the invention in any way.

In the preceding embodiment, the nozzle is supported on a bracket that is manually adjustable, as illustrated in FIG. 10, to which brief reference is made. However, if it is desired to place the angular positioning of the axis of the nozzle and the positioning of the height of the nozzle tip under computer control, a more highly automated nozzle and support assembly, such as illustrated in side view of FIG. 15, may be substituted. For convenience, the elements that are incorporated in the assembly of FIG. 15 that correspond to elements in the manually adjustable assembly of FIG. 10 are identified by the same number, primed, and the description need not be repeated.

In this assembly, the arcuate slot is used merely as a guide for the pivotal movement of bracket 49', eliminating the nut of the clamping bolt associated with the slot. The platform 50' is supported atop the inverted L-shaped bracket by a pneumatic actuator 58, pictorially illustrated. The movable portion of actuator 58 is attached to the underside of the platform and is strong enough to support the entire assembly. Another pneumatic actuator 59, pictorially illustrated, is pivotally anchored to the upper surface of platform 50' and its extensible portion is attached to the bracket 49' supporting nozzle 3'.

Actuator 58 is connected by hose 69 to an output peripheral of controller 9, and actuator 59 is similarly connected by hose 68. By controlling the pressure applied to actuator 58, the controller controls the vertical (Z-axis) position of the tip of nozzle 3' above the L-shaped pedestal. Similarly, by controlling the pressure applied to actuator 59, the actuator is able to either pivot the bracket 49', and nozzle 3' to the left about the pivot point, increasing the angle $\alpha$, the angle of tilt, or pivot the bracket down to the right in the figure, decreasing that angle.

A height sensor 60, pictorially illustrated, is connected to an input, not illustrated, of the controller to provide feedback to the controller of the height. A tilt sensor 67, pictorially illustrated, is connected to another input, not illustrated, of the controller and provides feedback to the controller of the tilt angle. The controller is programmed to process the respective height and angle information, determine if the height and inclination are achieved and actuate the respective pneumatic adapters to do so.

Figure 15:
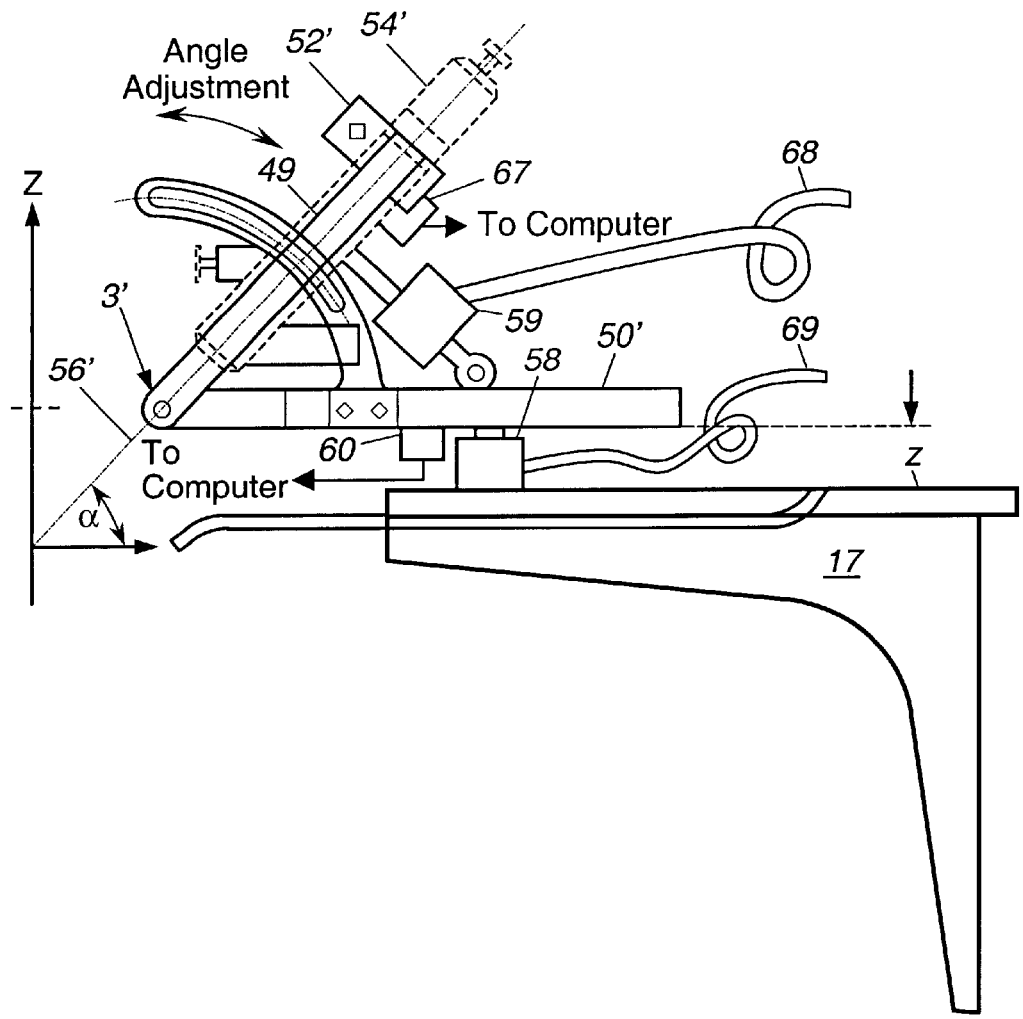
FIG. 15 illustrates an alternative nozzle and support structure assembly to that shown in FIG. 10.

The foregoing provides additional flexibility to the spray cleaning apparatus. As those skilled in the art appreciate, the foregoing controller-controlled adjustment devices presented in FIG. 15 are merely illustrative. Alternative structures may be found or designed to produce the same functions, although they will differ in detail. All such alternatives should be understood to fall within the scope of the invention.

Figure 16:
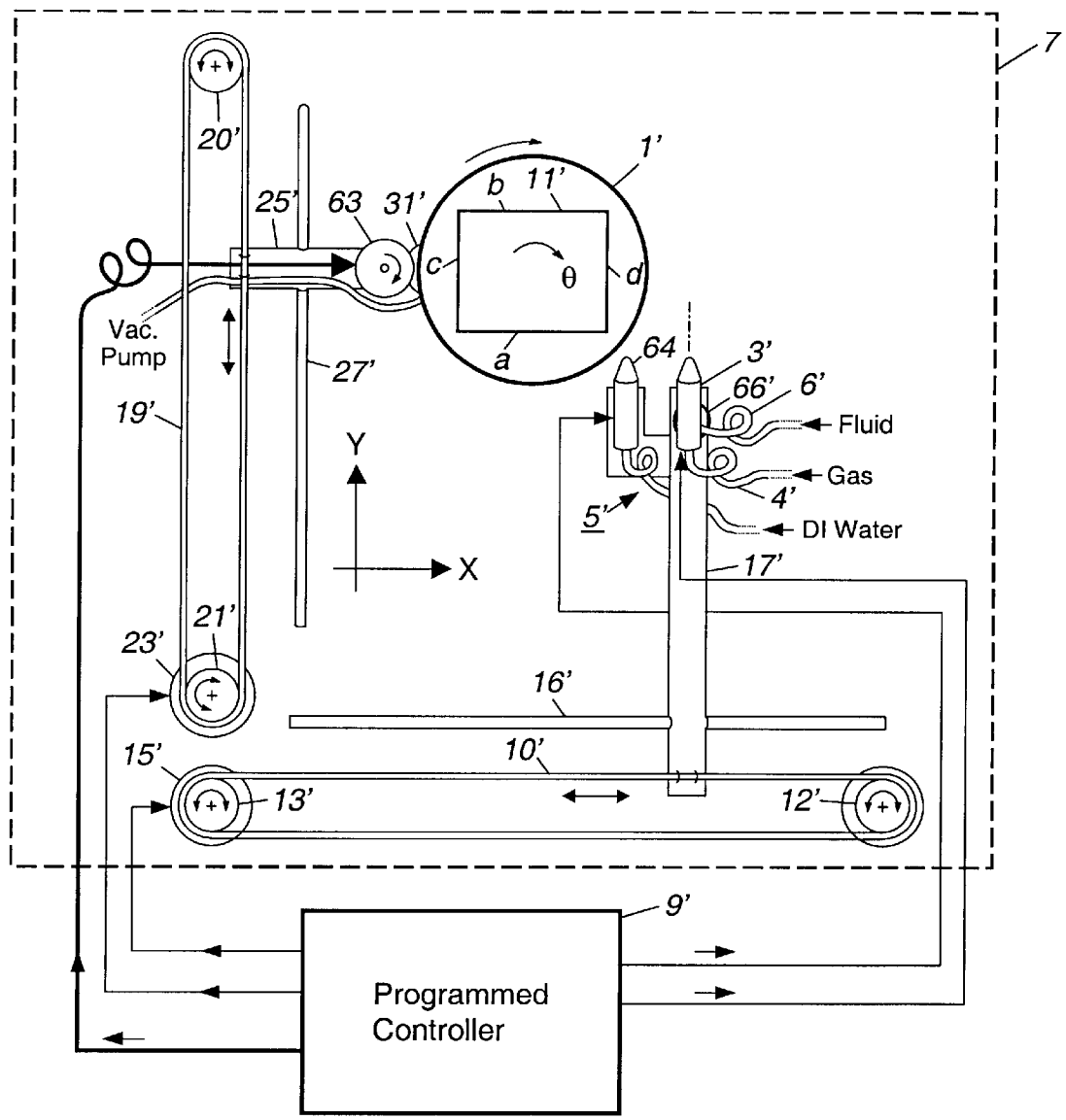
FIG. 16 illustrates another embodiment of the invention that combines the features of a number of alternative embodiments.

A number of additional modifications and improvements become apparent from an understanding of the foregoing description, which for simplicity may be incorporated collectively in the illustration of FIG. 16 to which reference is made. It may be noted that those elements in FIG. 16 that are the same as elements in the embodiment of FIG. 1 are identified by the same number, primed. It is thus be unnecessary to repeat the structure and function of the corresponding elements in this embodiment, which were earlier described.

In the prior embodiment, a pneumatic motor 29 was used to position the spindle or vacuum chuck 1 at various angles of rotation under control of the programmed controller 9. In this alternative embodiment the pneumatic motor is replaced with another electric motor 63 of a type that does not produce electrical sparks; and that motor is controlled by programmed controller 9' as represented by the control line leading thereto. Electric motor 63 may position the vacuum chuck at any angle of rotation, essentially performing the same functions as pneumatic motor 63 of the prior embodiment. However, in addition, the controller 9' may provide a control input that requires electric motor 63 to rotate or spin continuously for a predetermined duration prescribed by the program of the controller.

Such continuous rotation serves an additional function in the spray cleaner combination. Consider that the spray cleaning apparatus is used to spray clean wafer 11' in the manner previously described. Upon completion of the spray cleaning of the wafer, it may be desirable to dry the wafer, before removing the wafer from the apparatus. Accordingly, instead of being programmed to halt activity as in the prior embodiment, the controller 9' is programmed to operate motor 63 continuously for a selected interval. In so doing, the motor spins vacuum chuck 1' at a high rotational rate to spin-dry the wafer. The high centrifugal force created by spinning forces any liquid on the wafer to be thrown off. Following completion of the foregoing spin dry operation, the controller then terminates spray cleaning operation.

The embodiment of FIG. 1 contained a single spray nozzle. A further alternative embodiment of the invention may contain more than one spray nozzle. Continuing with FIG. 15, a second spray nozzle 64 is included in the combination. That additional spray nozzle is supported on a bracket that is joined to bracket 17' that supports nozzle 3', and, hence, moves in unison with the latter nozzle and vice-versa. Spray nozzle 64 is coupled by a flex hose to a source of de-ionized water ("DI water") and/or methanol as is indicated in the figure.

In such an embodiment controller 9' is programmed to connect the DI water to the hose, through a valve, not illustrated, upon conclusion of the cleaning step described in connection with the operation of the embodiment of FIG. 1. The controller may be programmed to repeat the relative movement of nozzle 64 over the entire disk, as occurred in the case of the spray cleaning or position the nozzle at a strategic position relative to wafer 11' and then allowed to remain open, spraying out the DI water (or, as appropriate, methanol). The DI water (or, as appropriate, methanol) thereby rinses off wafer 11'. Preferably, the spray cleaning apparatus is constructed and programmed to include both the additional nozzle structure and rinse cycle as well as the continuous spin motor and spin-dry cycle described in the immediately preceding paragraphs. In that way, following the spray cleaning of the wafer, the wafer is rinsed and spin-dried.

In a still further alternative embodiment controller 9' is programmed to initially position spray cleaning nozzle 3' at the center of the vacuum spindle 1' on commencement of the spray cleaning of wafer 11'. Then motor 63 is commanded by controller 9' to spin continuously so that the wafer 11' spins with a rotational speed from about ten to 500 revolutions per minute. Concurrently, the controller slowly operates motor 15' to move nozzle 3' laterally to the right to the outer edge of the wafer. As one appreciates, the foregoing relative movement between wafer 11' and nozzle 3' is more of a polar coordinate system of movement in lieu of the Cartesian system described in connection with the operation of FIG. 1.

As is apparent, the foregoing movement does not require movement of Y-axis positioner motor 20'. Were the polar movement the only type of movement required (or desired), a form of the apparatus could be designed that eliminated that positioner. However, the preferred form is to retain the Y-axis movement capability in a single apparatus to allow the spray cleaning apparatus to possess a maximum flexibility for programmed operation.

In a still further alternative embodiment nozzle 3' is supported by a positioner motor 66' that in turn is controlled by controller 9' as represented by the control line. When energized, positioner motor 66' turns and thereby changes or adjusts the angular orientation of the axis of spray nozzle 3'. The foregoing structure is combined with the structure and programming described in the paragraph before the preceding paragraph. More specifically, controller 9' is programmed to initially position spray cleaning nozzle 3' at the center of the vacuum spindle 1' on commencement of the spray cleaning of wafer 11'. Then motor 63' is commanded by controller 9' to spin continuously so that the wafer 11' spins with a rotational speed from about ten to 500 revolutions per minute. Concurrently, controller 9' slowly operates motor 15' to move nozzle 3' laterally to the right to the outer edge of the wafer and operates motor 66' to periodically sweep nozzle 3' over an angle of 180 degrees, back and forth.

Figure 17:
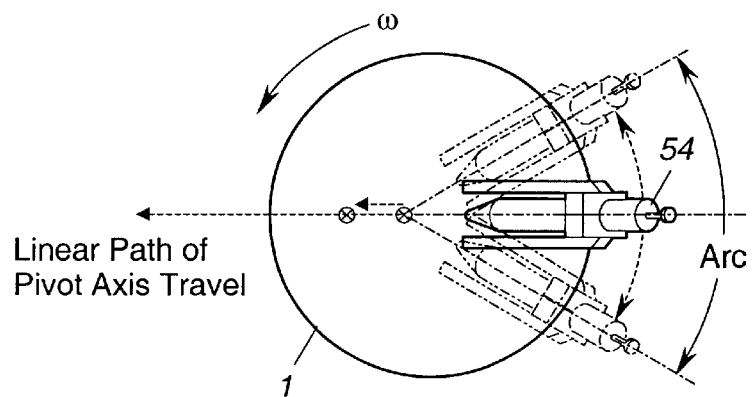
FIG. 17 illustrates the movement undertaken by the nozzle and vacuum chuck elements of one of the embodiments of the invention included in FIG. 16 and is presented to aid in the description of operation.

The foregoing motion is illustrated in FIG. 17 to which reference may be made. The nozzle is pivoted over an arc, the pivot point being formed on a bracket, not illustrated. That allows the nozzle to be directed in different directions. All the while the bracket, not illustrated, holding the nozzle and the pivot point is being carried forward along the linear path indicated by dash lines. Simultaneously the vacuum chuck is being rotated about its axis at varying rates ω. The foregoing angular reciprocation of the nozzle and its movement along the X-axis with simultaneous spinning of the vacuum chuck 1' ensures a good cleaning of the wafer.

In still further embodiments, nozzle 3 in the embodiment of FIG. 1 may be replaced by multiple spray nozzles, each of which is connected to the supply of fluid and gas to which nozzle 3' is connected. The multiple nozzles are spaced laterally so as to cover different portions of wafer 11. Such an arrangement allows the surface of the wafer to be covered more quickly with the cleaning spray since the nozzles cover different regions of the wafer surface. The wafer surface is cleaned with less physical movement required of the nozzles. As a consequence, the slightly more complex combination permits more rapid processing or "throughput".

As those skilled in the art appreciate, the cleaning apparatus may be enhanced further by the incorporation of a suitable robotics system for loading and unloading of the wafer in the cleaning apparatus, such as the familiar cassette to cassette wafer transfer system, in lieu of the manual system described in connection with FIG. 1.

Lastly, the foregoing embodiments describe a cleaning system for spray cleaning wafers one at a time. As those skilled in the art appreciate, spray cleaning of a number of wafers may be accomplished with the invention by enlarging the housing for the apparatus and providing multiple numbers of elements for handling multiple wafers simultaneously, all of which comes within the scope of the invention. In such a system, as example a plurality of vacuum chucks may be operated in tandem by a single Y-axis positioner and a plurality of nozzles, one or more associated with each of the plurality of vacuum chucks, are supported by an X-axis position for joint movement, which is operated under control of a single controller. Each of the nozzles would be connected to the fluid and gas hoses (described in FIG. 1) and the housing is enlarged in size to accommodate all such elements. A wafer may be placed in each vacuum chuck, and cleaning operation commenced. The cleaning operation is essentially the same as described for cleaning a single wafer. A like tandem arrangement for cleaning a plurality of wafers simultaneously may be employed for each of the alternative embodiments previously described.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. An automated cleaning apparatus for cleaning semiconductor wafers, comprising:
   a chuck for holding a wafer to be cleaned a hydraulic broom for automatically sweeping in a continuous pattern the entire surface of said wafer with solvent fluid;
   a base for supporting said hydraulic broom and said chuck;
   each of said chuck and said hydraulic broom being movably mounted to said base
   programmed controller means for controlling the sweep of said hydraulic broom; said programmed controller means for prescribing relative movement between said hydraulic broom and said chuck in a predefined pattern over the entire surface of the wafer;
   said programmed controller means further comprising:
     a programmed controller;
     a three-axis positioner controlled by said programmed controller;
     said three-axis positioner including a first positioning motor for positioning said hydraulic broom along a firs axis of a Cartesian coordinate system, a second positioning motor for positioning said chuck along a second axis of said Cartesian coordinate system, and a third positioning motor for controlling the angular position of rotation of said chuck, said third positioning motor being positioned along said second axis together with said chuck by said second positioning motor.

2. The cleaning apparatus as defined in claim 1, wherein each of said first and second positioning motors comprise a servo-motor.

3. The cleaning apparatus as defined in claim 2, wherein said third positioning motor further comprises a pneumatic stepper motor.

4. The cleaning apparatus as defined in claim 3, wherein said hydraulic broom further comprises: an aspirating nozzle, said aspirating nozzle including a gas inlet for receiving pressurized gas, a fluid inlet for coupling to a reservoir of solvent fluid, and a nozzle outlet, wherein a stream of gas from said gas inlet through said nozzle outlet aspirates a solvent fluid from said fluid inlet into said stream to produce an aspirated fluid spray at said nozzle outlet to impact said wafer.

5. The cleaning apparatus as defined in claim 4, wherein said aspirating nozzle outlet includes an axis, and further comprising: a adjustable bracket for mounting said aspirating nozzle, said bracket including first adjustment means for setting said axis at a predetermined angle relative to the upper surface of said chuck and a second adjustment means for setting said nozzle outlet at a desired elevation, said desired elevation being greater than said elevation of said upper surface of said chuck.

6. The cleaning apparatus as defined in claim 5, wherein said predetermined angle falls in range of twenty degrees to seventy degrees.

7. The cleaning apparatus as defined in claim 4, further comprising: a drip tube, said drip tube for connection to a source of solvent for dispensing droplets of solve t onto said wafer; said drip tube being mounted for movement with said hydraulic broom and being located behind said broom, wherein said droplets of solvent drip into portions of said wafer after said portions have been impacted by said aspirated fluid spray.

8. The cleaning apparatus as defined in claim 6, further comprising: a drip tube, said drip tube for connection to a source of solvent for dispensing droplets of solvent onto said wafer; said drip tube being mounted for movement with said hydraulic broom and being located behind said broom, wherein said droplets of solvent drip onto portions of said wafer after said portions have been impacted by said aspirated fluid spray.

9. The cleaning apparatus as defined in claim 7, wherein said chuck further comprises a vacuum chuck.

10. The cleaning apparatus as defined in claim 1 wherein said controller includes mean for commanding said third positioning motor to spin said chuck and, concurrently, said second positioning motor to periodically pivot said hydraulic broom over a predetermined arc.

11. The cleaning apparatus as defined in claim 10, wherein said controller includes means for commanding said third positioning motor to spin aid chuck upon completion of sweeping by said hydraulic broom.

12. The cleaning apparatus as defined in claim 5, further comprising: a first motor for spinning said chuck, said first motor being controlled by said controller; a second motor for periodically pivoting said hydraulic broom over a predetermined arc, said second motor being controlled by said controller and wherein said controller includes means for commanding said first motor to spin said chuck and, concurrently, said second motor tot periodically pivot said hydraulic broom over said predetermined arc about a pivot axis and command said three-axis positioner to move said pivot axis of said hydraulic broom along a straight line.

13. The cleaning apparatus as defined in claim 5, wherein each of said first and second adjustment cans is controlled by said controller, whereby said nozzle outlet is set to a height and said nozzle axis is set to an angle prescribed by said controller.

14. The cleaning apparatus for cleaning semiconductor wafers, comprising:
   a chuck for holding a wafer to be cleaned;
   a hydraulic broom for automatically sweeping in a continuous pattern the entire surface of said wafer with solvent fluid;
   said hydraulic broom comprising; an aspirating nozzel, said aspirating nozzel including a gas inlet for receiving pressurized gas a fluid inlet for coupling to a reservoir of solvent fluid, and a nozzle outlet, wherein a stream of gas from said gas inlet through said nozzle outlet aspirates solvent fluid from said fluid inlet into said stream to produce an aspirated fluid spray at said nozzle; outlet outlet to impact said wafer;
   a base for supporting said hydrolic broom and said chuck and each of said chuck and said hydrolic broom being moveably mounted to said base;
   a first drip tube, said first drip tube for connection to a source of solvent for dispensing droplets of solvent onto said wafer; said first drip tube being located behind said hydraulic broom and being mounted for movement with said hydraulic broom, wherein said dispensed droplets of solvent deposit onto portions of said wafer after said portions of said wafer have been Impacted by said aspirated fluid spray;

programmed controller means for controlling the sweep of said hydraulic broom; said programmed controller means for prescribing relative movement between said hydraulic broom and said chuck in a predefined pattern over the entire surface of the wafer and further comprising:

a programmed controller;

a three-axis positioner controlled by said programmed controller;

said three-axis positioner including a first positioning motor for positioning said hydraulic broom along a first axis of a Cartesian coordinate system, a second positioning motor for position said chuck along a second axis of said Cartesian coordinate system, and a third positioning motor for controlling the angular position of rotation of said chuck said third positioning motor being positioned along said second axis together with said chuck by said second positioning motor;

each of said first and a second positioning motors comprising a servo-motor and said third positioning motor comprising a pneumatic stepper motor;

a housing for confining said base, said hydraulic broom, said chuck and said three-axis positioner during cleaning, said housing including a door for providing access to the interior of said housing, a drain for removing debris and solvent fluid from said interior during cleaning, and a vent for removing vapors from said Interior of said housing during cleaning; and a second drip tube, said second drip tube being located over said door; said second drip tube for connection to a source of solvent for dispensing droplets of solvent when said door is open.

15. The cleaning apparatus as defined in claim 14, wherein said door is electrically operated and controlled by said programmed controller; and wherein said programmed controller includes a keypad to permit operator selection of multiple programs, including a first button for initiating a cleaning program and a second button for initiating an exit program, aid exit program for producing opening of said door and movement of said chuck through said open door to a withdrawn position outside said housing.

16. The method of cleaning the surface of a semiconductor wafer comprising the steps of:

(a) supporting said wafer on a surface within an enclosure;

(b) applying a sprayer to spray fluid solvent at said wafer; and (c) moving said sprayer over the surface of said wafer;

said step of moving said sprayer over the surface of said wafer, further comprising the steps of:

(c1) moving said sprayer across the surface of the wafer from one side to the other side at a first front to be position on said wafer, incrementing said front to back position of said sprayer from said first front to back position, and moving said sprayer from said other side back to said one side, further incrementing said front to back position of said sprayer from the immediately preceding first front to back position of said sprayer, and moving said sprayer form said one side to said other side; and continuing the foregoing incrementing of the front to back position of said sprayer and sideways moving of said spinner, until the sprayer has been incremented from the front to the back position of said wafer and completed a last sideways movement to one side or the other side of said wafer;

(d) rotating the wafer by ninety degrees; and (e) moving said sprayer across the surface of the wafer from one side to the other side at a first front to back position on said wafer, Incrementing said front to back position of said sprayer from said first front to back position, and moving said sprayer from said other side back to said one side, further incrementing said front to back position of said sprayer from the immediately preceding first front to back position of said sprayer, and moving said sprayer form said one side to said other side; and continuing the foregoing incrementing of the front to back position of said sprayer and sideways moving of said sprayer, until the sprayer has been incremented from the front to the back position of said wafer and completed a last sideways movement to one side or the other side of said wafer.

17. The method of cleaning the surface of a semiconductor wafer defined in claim 16, further comprising the additional step oft spinning said wafer to remove liquid from the surface of said wafer.

* * * * *

UNITED STATES PATENT AND TRADEMARK OFFICE
CERTIFICATE OF CORRECTION

PATENT NO. : 6,638,366 B2
DATED : October 28, 2003
INVENTOR(S) : Michael D. Lammert et al.

It is certified that error appears in the above-identified patent and that said Letters Patent is hereby corrected as shown below:

Column 15,
Line 11, "cleaned a" should read -- cleaned; a --; and
Line 31, "firs" should read -- first --.

Column 16,
Line 1, "solve t" should read -- solvent --;
Line 24, "aid" should read -- said --;
Line 33, "tot" should read -- to --;
Line 38, "cans" should read -- means --;
Lines 48 and 49, "nozzel" should read -- nozzle --;
Line 50, "gas" should read -- gas, --;
Line 55, "nozzle; outlet outlet" should read -- nozzle outlet --; and
Lines 56 and 57, "hydrolic" should read -- hydraulic --.

Column 17,
Line 41, "aid" should read -- said --.

Column 18,
Line 10, "be" should read -- back --; and
Line 19, "spinner" should read -- sprayer --.

Signed and Sealed this

Twenty-third Day of December, 2003

JAMES E. ROGAN
*Director of the United States Patent and Trademark Office*